United States Patent
Gupta et al.

(10) Patent No.: US 9,979,411 B1
(45) Date of Patent: May 22, 2018

(54) DELTA SIGMA ADC WITH OUTPUT TRACKING FOR LINEARITY

(71) Applicant: TEXAS INSTRUMENTS INCORPORATED, Dallas, TX (US)

(72) Inventors: Amit Kumar Gupta, Frisco, TX (US); Peng Cao, Richardson, TX (US); Venkata Krishnan Kidambi Srinivasan, Tucson, AZ (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days. days.

(21) Appl. No.: 15/394,100

(22) Filed: Dec. 29, 2016

(51) Int. Cl.
H03M 3/00 (2006.01)

(52) U.S. Cl.
CPC ........... *H03M 3/496* (2013.01); *H03M 3/458* (2013.01)

(58) Field of Classification Search
None
See application file for complete search history.

(56) References Cited

U.S. PATENT DOCUMENTS

| | | | | |
|---|---|---|---|---|
| 5,412,387 A * | 5/1995 | Vincelette | ............. | H03M 3/324 341/143 |
| 5,729,232 A * | 3/1998 | Fujimori | ................. | H03M 3/35 341/143 |
| 5,790,064 A * | 8/1998 | Fujimori | ............... | H03M 3/322 341/155 |
| 6,573,850 B1 * | 6/2003 | Pennock | ............... | H03M 3/368 341/144 |
| 6,952,176 B2 * | 10/2005 | Frith | ..................... | H03M 3/322 341/143 |
| 7,129,875 B1 * | 10/2006 | Altun | .................... | H03M 3/322 341/120 |
| 7,489,263 B1 * | 2/2009 | Drakshapalli | ........... | H03M 3/35 341/108 |
| 8,749,425 B1 * | 6/2014 | Hu | ...................... | H03M 1/0845 341/155 |

* cited by examiner

*Primary Examiner* — Howard Williams
(74) *Attorney, Agent, or Firm* — Andrew Viger; Charles A. Brill; Frank D. Cimino

(57) ABSTRACT

An exemplary circuit includes a tracking circuit, a current estimator, a switch control logic, and a switching load circuit. The tracking circuit tracks a digital output signal of a delta-sigma modulator (DSM) and provides a tracking signal representing an average of the digital output signal during a time period. The current estimator determines an amount of loading to be applied to positive and negative reference voltages based on the tracking signal. The switching load circuit is coupled to positive and negative reference voltages of the DSM, the switching load circuit connects a selected amount of loading to the positive and negative reference voltages in response to a control signal to balance a reference load current applied to the DSM. The switch control logic provides the control signal to the switching load circuit based on the determined amount of loading to be applied to the positive and negative reference voltages.

20 Claims, 3 Drawing Sheets

DELTA SIGMA ADC WITH OUTPUT TRACKING FOR LINEARITY

TECHNICAL FIELD

This disclosure relates generally to an analog-to-digital converter, and more specifically to reference load balancing for an analog-to-digital converter.

BACKGROUND

In electronics, an analog-to-digital converter (ADC) is a device that converts an analog signal into a digital signal. For example, ADCs sample, analog signals at a sampling frequency to create a discrete time signal. This discrete time signal is compared with a reference voltage and converted to a digital signal with finite number of levels. This process introduces quantization noise.

ADCs can employ delta-sigma ($\Delta\Sigma$) modulation to provide dynamic ranges beyond what is possible with other ADC architectures. As one example, a $\Delta\Sigma$ ADC samples an input signal at a rate higher than the Nyquist frequency using an oversampling modulator, which is followed by a digital/decimation filter. Together, the oversampling modulator and the digital/decimation filter produce a high-resolution datastream output.

SUMMARY

One example includes a circuit that includes a tracking circuit, a current estimator, a switch control logic, and a switching load circuit. The tracking circuit tracks a digital output signal of a delta-sigma modulator and provides a tracking signal representing an average of the digital output signal during a time period. The current estimator determines an amount of loading to be applied to positive and negative reference voltages based on the tracking signal. The switching load circuit is coupled to positive and negative reference voltages of the delta-sigma modulator, the switching load circuit connects a selected amount of loading to the positive and negative reference voltages in response to a control signal to balance a reference load current applied to the delta-sigma modulator. The switch control logic provides the control signal to the switching load circuit based on the determined amount of loading to be applied to the positive and negative reference voltages.

Another example includes a method comprising tracking a digital output signal of a delta-sigma modulator. The method also includes determining an amount of current to apply to positive and negative reference voltages of the delta-sigma modulator based on the digital output signal. The method also includes generating a control signal indicating the amount of current to apply to the positive and negative reference voltages. The method also includes configuring, based on the control signal, a variable switching load which is coupled to the positive and negative reference voltages. The method also includes balancing a reference current that is applied to the delta-sigma modulator via the positive and negative reference voltages according to the configuration of the variable switching load.

Another example includes another device that includes a delta-sigma modulator, a tracking circuit, a switch control logic, and a switching load circuit. The delta-sigma modulator provides a digital output signal in response to an analog input signal and based on positive and negative reference voltages. The tracking circuit tracks a digital output signal of the delta-sigma modulator and provides a tracking signal representing an average of the digital output signal during a time period. The control logic provides a control signal to select an amount of loading based on the tracking signal. The switching load circuit is coupled to positive and negative reference voltages of the delta-sigma modulator, the switching load circuit connecting the selected amount of loading to the positive and negative reference voltages in response to the control signal to balance a reference load current applied to the delta-sigma modulator.

DETAILED DESCRIPTION

This disclosure relates generally to an analog-to-digital converter (ADC), and more specifically to reference load balancing for an analog-to-digital converter. In certain implementation of ADC's current drawn from the reference voltages swings from low to high value based on the input signal. This input signal dependent reference load current results in errors in a digital representation of an analog input signal, generated by the ADC. Systems and methods disclosed herein switch in and out a variable load to the reference voltages based on tracking the digital output of delta-sigma modulator to balance the varying reference current such as to provide constant reference load current at this peak value that is applied to the ADC over time. Application of this constant reference load current to the ADC improves the distortion performance of the ADC.

In one example, a circuit includes a tracking circuit, a current estimator, a switch control logic, and a switching load circuit. The tracking circuit tracks the digital output signal of the $\Delta\Sigma$ modulator and provides a tracking signal representing an average of the digital output signal during a time period (e.g., one or more clock cycles). The current estimator provides a control signal to specify an amount of loading based on the tracking signal. The switch control logic controls the timing to connect the switching load circuit to the positive and negative reference voltages. The switching load circuit is coupled to reference voltages of the ADC (e.g., VREFM and VREFP) and is configured to connect the specified amount of loading to the reference voltages in response to the control signal. For example, the switching load circuit can be implemented as a capacitor array that connects a variable load to the ADC reference voltages based on the control signal. The loading applied to the reference voltages balances reference current applied to the analog-to-digital converter by the reference voltages. This arrangement allows the reference current to be balanced at the constant reference current, such as at a peak current value, thereby improving the distortion performance of the ADC. Moreover, this arrangement is implemented in parallel with the analog-to-digital converter to prevent generation of noise or any other disturbance that interferes with operation of the analog-to-digital converter.

Figure 1:
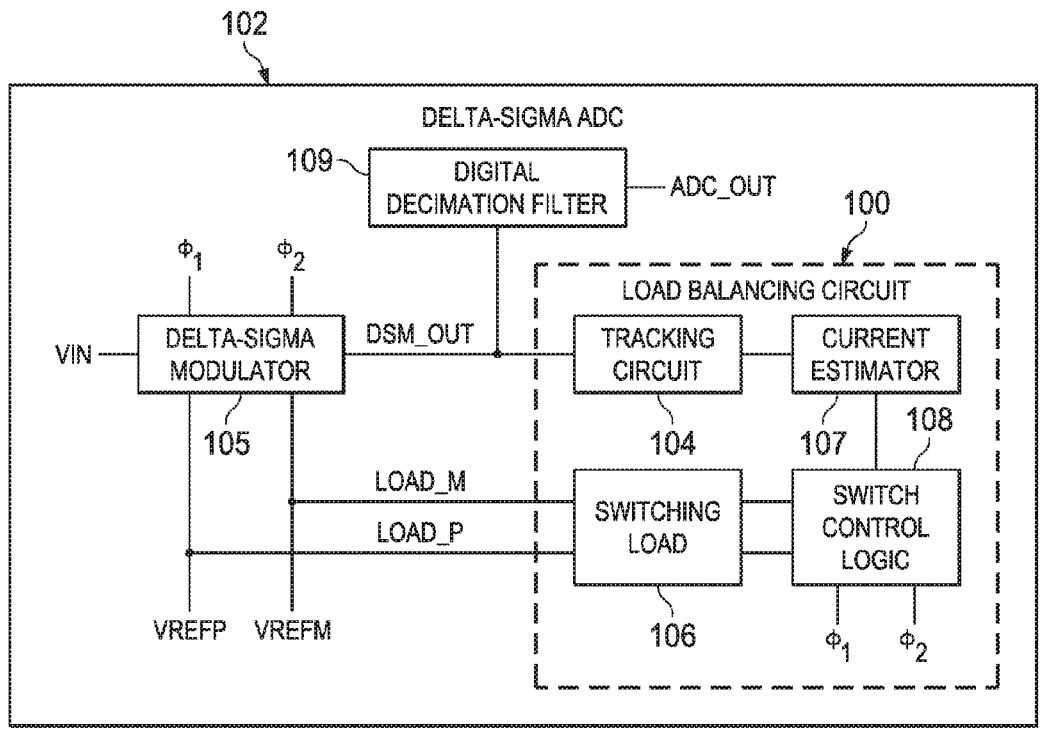
FIG. 1 illustrates an example of a device to balance a reference load of an ADC.

FIG. 1 illustrates an example of a load balancing circuit 100 to balance a reference load current of an ADC 102. The load balancing circuit 100 is coupled to the output of a delta-sigma (ΔΣ) modulator 105 and to reference voltages of the ΔΣ modulator 105, demonstrated as VREFP and VREFM. The load balancing circuit 100 includes a tracking circuit 104, a current estimator 107, a switch control logic 108 and a switching load circuit 106. In an example, the ADC 102 is implemented as a differential delta-sigma ADC, such as including a single shared capacitor array for each differential input and reference feedback, and including a 3-level DAC decoding logic for each unit element (see, e.g., FIG. 6) that reduces thermal noise on capacitors, which is proportional to KT/C, and power consumption on reference voltages applied thereto.

ΔΣ modulator 105 receives an analog input signal at an input thereof and generates a corresponding digital representation of the analog input signal at an output thereof, demonstrated at DSM_OUT. In an example, the ΔΣ modulator 105 has feedback that includes a multi-level DAC. Each element of the DAC can be connected to positive reference VREFP, negative reference VREFM or reference common mode REFCM=(VREFP+VREFM)/2. This three-level decoding of DAC codes causes input signal dependent load current on terminals that receive reference voltages VREFP and VREFM. In conjunction with applying the reference voltages VREFP and VREFM at the reference terminals, corresponding reference current is applied via each reference terminal to the ADC 102, such as having the same current amplitude but opposite polarity. The ADC 102 includes inputs to receive the positive and negative reference voltages VREFP and VREFM. The ADC 102 further receives two or more clock signals, demonstrated at $\Phi_1$ and $\Phi_2$ The clock signals $\Phi_1$ and $\Phi_2$ control operating phases of the ADC 102. For example, each of the clock signals have approximately fifty-percent duty cycle and are non-overlapping, such that the two clock phases are never high at the same time. As a further example, clock signal $\Phi_1$ triggers a sampling phase of the ADC 102 and clock signal $\Phi_2$ triggers an integration phase of the ADC 102 in which the ADC 102 integrates the difference between the analog input signal and a feedback signal representing the output of the ΔΣ modulator 105.

As mentioned, the load balancing circuit 100 is coupled to the delta-sigma modulator 105. The circuit 100 includes the tracking circuit 104, a current estimator 107, a switch control logic 108 and switching load circuit 106 to provide loading LOAD_P and LOAD_M to produce a balancing current for the voltage references VREFP and VREFM, respectively. In the example of FIG. 1, an input of the tracking circuit 104 is coupled to an output of ΔΣ modulator 105, the DSM_OUT line, to receive the digital output signal generated by the ΔΣ modulator 105. The tracking circuit 104 tracks the digital output signal generated by the ΔΣ modulator 105. Based on this tracking, the tracking circuit 104 provides a tracking signal representing an average of the digital output signal during a time period. The time period for averaging is a based on a trade-off between load balancing current resolution and delay in applying the balancing current to the positive and negative reference voltages VREFP and VREFM. The current estimator 107 determines the amount of load adjustment that is to be applied to the positive and negative reference voltages VREFP and VREFM, respectively, which are applied to the ADC 102.

The current estimator 107 may determine the amount of reference load current adjustment based on the tracking signal.

An output of the current estimator 107 is coupled an input of the switch control logic 108. The switch control logic 108 also receives the clock signals $\Phi_1$ and $\Phi_2$. The switch control logic 108 provides a control signal to control an amount of loading provided by the switching load circuit 106 based on the tracking signal and based on the clock signals $\Phi_1$ and $\Phi_2$. For example, the switch control logic 108 provides the control signal to select the amount of loading to apply depending on the digital output signal DSM_OUT. The switch control logic 108 thus provides control signals to apply loading current LOAD_P and LOAD_M that adjusts the reference current applied by the respective reference voltages VREFP and VREFM. The switch control logic 108 thus provides the control signal to selectively activate the switching load circuit 106 and achieve reference current balancing.

The switching load circuit 106 is coupled to receive the control signal at an input thereof and is also coupled to nodes corresponding to the voltage references VREFP and VREFM. The switching load circuit 106 connects the selected amount of loading that is applied to the positive and negative reference voltages VREFP and VREFM in response to the control signal to balance reference load current applied to the ADC 102. For example, the switching load circuit 106 selectively connect one or more loads (e.g., capacitive loads) LOAD_P and LOAD_M to each of the reference voltages VREFP and VREFM based on the control signal and based on the clock signals $\Phi_1$ and $\Phi_2$. The timing provided by the clock signals enables the loading to be applied during a selected phase of the ADC operation, such as the integration phase. Such application of the loading to the ADC 102 provides current adjustment to the reference current provided to the ADC 102 that balances the total average current to a desired level, such as a constant peak reference current of the positive and negative reference voltages VREFP and VREFM. This results in an in an improvement in distortion performance of ADC 102.

Figure 2:
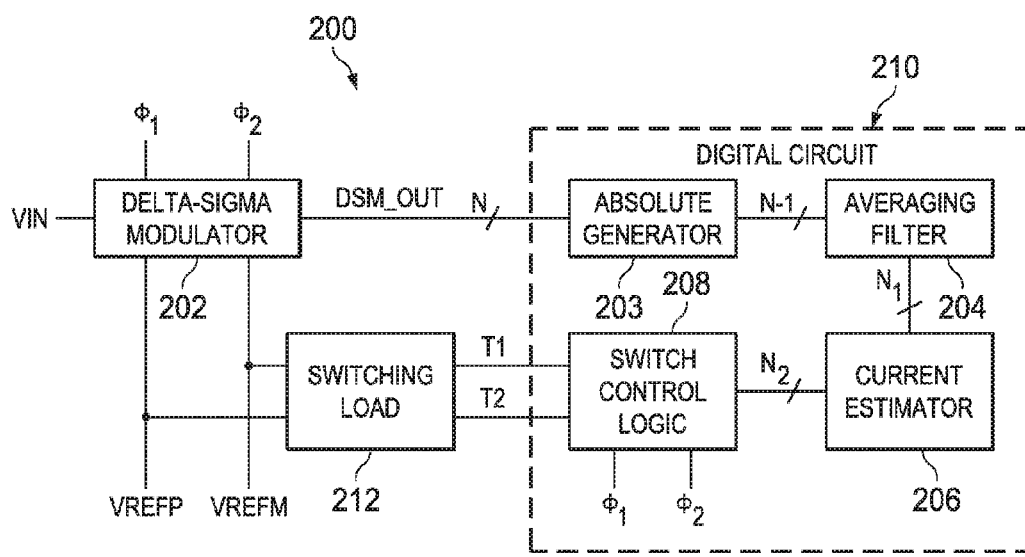
FIG. 2 illustrates an example of another device to balance a reference load of the ADC.

FIG. 2 illustrates another device, for example circuit 200, to balance reference current of a delta-sigma modulator 202. The circuit 200 includes a digital circuit 210 and a switching load circuit 212. In an example (FIG. 3), the switching load circuit 212 is implemented as a multi-bit switched capacitor array 310. The digital circuit 210 includes an absolute generator 203, an averaging filter 204, a current estimator 206, and switch control logic 208. The digital circuit 210 tracks the output of the delta-sigma modulator 202 and calculates current adjustment for balancing the reference current applied to the delta-sigma modulator 202. This current adjustment is generated by the switching load circuit 212 in response to the control signal from the digital circuit 210. In an example, the switching load circuit 212 is a switched capacitor array 310.

An input of the absolute generator 203 is coupled to receive the digital output of the delta-sigma modulator 202. The absolute generator 203 receives N bits from the delta-sigma modulator 202. The absolute generator 203 removes a sign bit associated with the output signal of the delta-sigma modulator 202. The sign (positive or negative) of the output of the delta-sigma modulator 202 is not used in determining a loading current of the positive and negative reference voltage VREFP and VREFM. As such, the sign bit of the digital output signal of the delta-sigma modulator 202 is removed by the absolute generator 203. The absolute generator 203 outputs a digital word with a size of N−1 bits.

An input of the averaging filter 204 is coupled to receive the sign-removed output from the absolute generator 203. The averaging filter 204 provides a time-averaged indication of the output signal of the delta-sigma modulator 202. The averaging filter 204 receives the N−1 bits from the absolute generator 203. The averaging filter 204 increases the resolution of the input to switching load circuit 212. The averaging filer 204 implements a transfer function H(z) in the digital domain, such as according to the following equation:

$$H(z) = \left(\frac{1 + z^{-1} + \ldots + z^{-(M-1)}}{M}\right)^x$$

where H(z) is a discrete time domain transfer function, or Z-domain,
$z^{-1}$ represents one clock cycle delay, such that $1+z^{-1}$ represents a current sample value plus the previous sample,
M is the number of delayed samples being added together, and
X is the order of the filter, or number of cascaded stages of the averaging filter.

As an example, the transfer function H(z) may be an averaging filter with low-pass frequency response. In such an example, a larger value of M represents more samples are being averaged and a lower bandwidth of the averaging filter. The averaging filter 204 produces $N_1$ bits, where $N_1=N-1+X*\log_2 M$.

An input of the current estimator 206 is coupled to receive the averaged output signal from the averaging filter 204. The current estimator 206, for example, receives the $N_1$ bits from the averaging filter 204. As an example, the current estimator 206 performs a piece-wise fitting that includes linear and quadratic curve fitting functions selected according the input Vin of the delta-sigma modulator 202. For instance, the current estimator 206 performs a quadratic fitting of time-averaged indication of output from filter 204 if an input signal of the delta-sigma modulator 202 is greater than (VREFP−VREFM)/$2^N$, where N is number of bits of a quantizer of the delta-sigma modulator 202. The current estimator 206 further performs a linear approximation of the time-averaged indication of output from filter 204 if input signal of the delta-sigma modulator 202 is less than (VREFP−VREFM)/$2^N$. The piece-wise curve fitting performed by current estimator 206 generates $N_2$ bits according to the equation $N_2=2*(N_1-1)$ representing a current adjustment to be applied at the reference voltage inputs of the ADC to balance the reference current.

An input of the switch control logic 208 is coupled to receive the output of the current estimator 206 and the clock signals $\Phi_1$ and $\Phi_2$. The switch control logic 208 thus receives the $N_2$ bits produced by the current estimator 206. The control logic 208 outputs these $N_2$ bits to the switching load circuit 212 according to the two clock signals $\Phi_1$ and $\Phi_2$. The switch control logic 208 connects the $N_2$ bits with the non-overlapping clock signals $\Phi_1$ and $\Phi_2$. The switch control logic 208 includes a first output terminal T1 and a second output terminal T2 that correspond to positive and negative input terminals T1 and T2 of the switching load circuit 212.

Figure 3:
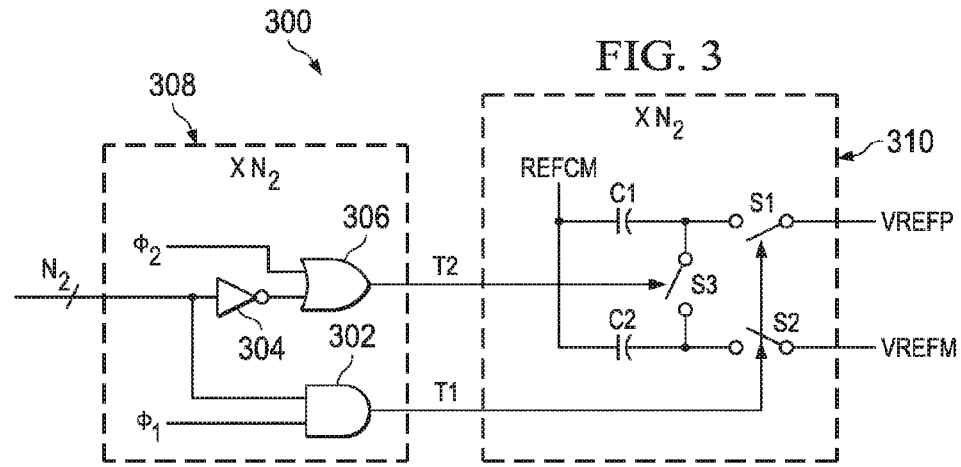
FIG. 3 illustrates a circuit diagram of an example switch control logic and switching load circuit.

An input of the switching load circuit 212 is coupled to the output of the switch control logic 208. The switching load circuit 212 is demonstrated as a capacitor array 310 in FIG. 3 that includes an arrangement of switches S1, S2 and S3 and capacitors C1 and C2 connected between nodes corresponding to reference voltages VREFP and VREFM and a corresponding common mode voltage REFCM. In some examples, the total capacitor value of the capacitor array 310 is one quarter of a total capacitor value of sampling capacitors C4 and C5 (FIG. 6) in the delta-sigma modulator 202, such that it would occupy a small percentage of the total ADC area. In FIG. 3, the capacitor array 310 may be implemented as either binary or thermometric. The capacitor array 310 includes inputs that receive control signals on terminals T1 and T2 from the switch control logic 308 to control switches S1, S2 and S3 to connect and disconnect capacitors C1 and C2 for capacitively loading reference voltages VREFP and VREFM. For example, the capacitive loading applies balancing current to references nodes VREFP and VREFM for balancing the reference currents over time and as the digital output DSM_OUT changes. This reference load balancing (e.g., constant reference load current) can improve the distortion performance of the ADC.

Thus, the switching load circuit 212 produces a current that is applied to the positive and negative voltages VREFP and VREFM that is timed according to the control signals T1 and T2 from the control logic 208. For instance, switching load circuit 212 produces a balancing current during an integration phase of the delta-sigma modulator 202. Application of the balancing current to the reference voltage nodes VREFP and VREFM, in response to control signals, thus can result in a constant reference current to positive and negative reference VREFP and VREFM.

FIG. 3 illustrates a circuit diagram 300 of an example switch control logic 308 that is connected to capacitor array 310, which correspond to switch control logic 208 and switching load circuit 212 as disclosed with respect to FIG. 2. The capacitor array 310 has $N_2$ set of capacitors with binary weighting. In the example of FIG. 3, the switch control logic 308 includes an AND gate 302, an inverter 304, and an OR gate 306.

A first input of the AND gate 302 is coupled to receive the clock signal $\Phi_1$ and a second input of the AND gate 302 is coupled to receive the output of the current estimator 206. Thus, the AND gate 302 controls the timing control signal T1 by logical ANDing the clock signal $\Phi_1$ and output of current estimator. The inverter 304 is coupled to provide an inverted version of output of current estimator 206 at an input of the OR gate 306. A second input of the OR gate 306 is coupled to receive the clock signal $\Phi_2$. Thus, the OR gate 306 controls the timing control signal T2 based on ORing the clock signal $\Phi_2$ and the inversion of output of current estimator 206.

Figure 4:
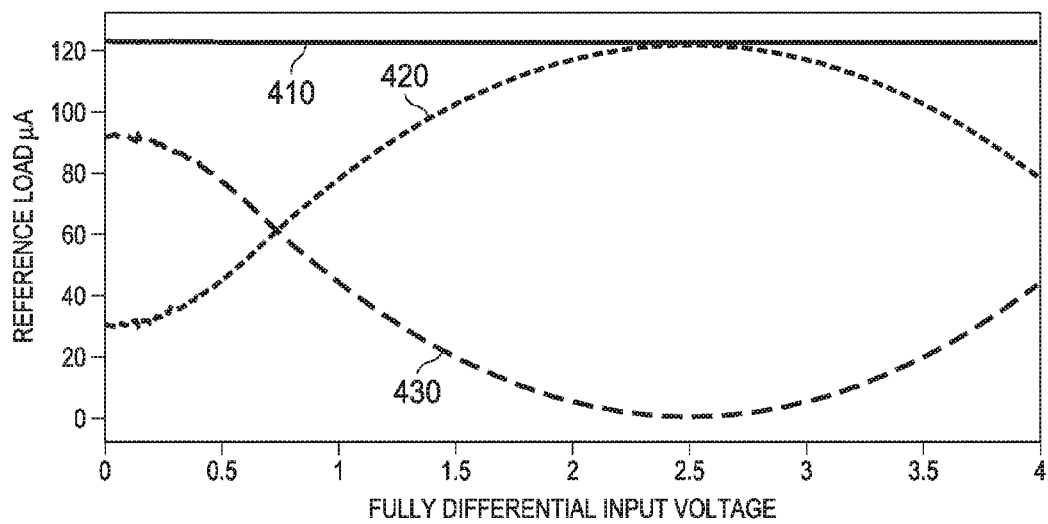
FIG. 4 illustrates an example reference load current diagram.

FIG. 4 illustrates an example reference load current diagram 400. The reference load current diagram 400 represents three currents curves: a reference load current curve 420 (for example, produced by VREFP or VREFM), a balancing current 430 produced by the switching load circuit 212, and an aggregate reference current line 410. These three current are illustrated as a result of varying fully differential input voltages.

By way of example, the voltage reference terminal VREFP produces the reference load current curve 420 that swings over a range of fully differential input voltages (e.g., 0 to 4 volts, from a minimum value of 0 μA to a maximum value of approximately 122 μA). To compensate for such a swing in the reference current 420, the switching load circuit 212 produces a balancing current in response to the control signal, which varies according to the estimated current value provided by current estimator 206. This balancing current produced by the switching load circuit 212 is illustrated as the balancing current 430. Once the balancing current produced by the switching load circuit 212 is added to the reference load current curve 420, the resultant current for reference voltage VREFP is illustrated as total reference current line 410. The circuits 100/200 continuously track the output of the delta-sigma modulator 105 as a basis for controlling the balancing current 430. As shown, the total reference current line 410 remains substantially constant during operation of the circuits 100/200, improving linearity of the ADC 102/202.

Figure 5:
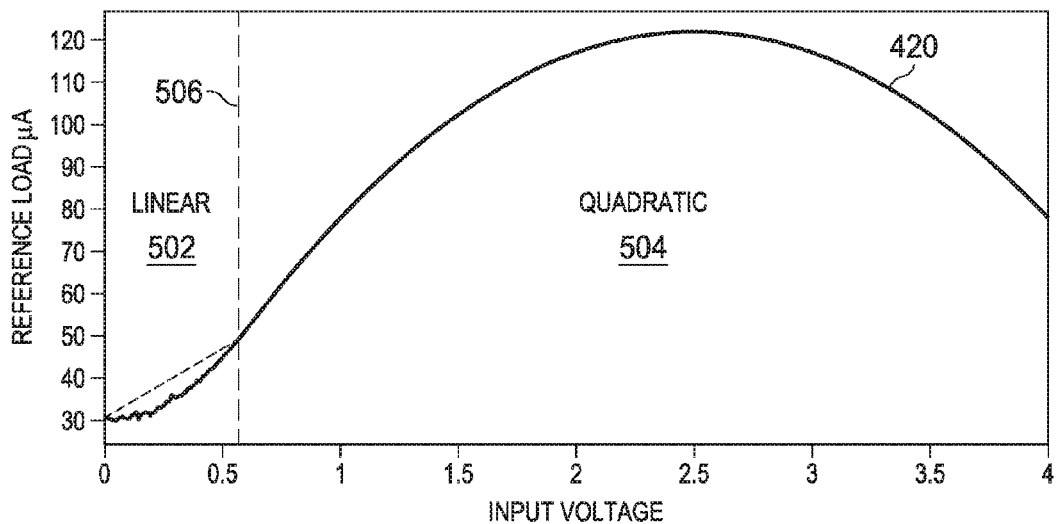
FIG. 5 illustrates example fittings that are applied for various fully differential references voltages of the ADC.

FIG. 5 illustrates example current estimation by curve fitting over a range of input voltages that are applied to the ADC 102. The current estimator 206 applies different fitting schemes based on the fully differential input voltages being applied to the ADC 102. As disclosed herein, the current estimator 206 determines the balancing current to be applied to the reference load current of the switching load circuit 212 to result in a constant total reference current applied to the switching load circuit 212, based on the input voltage. The current estimator 206 can apply different estimation techniques depending on the input voltage. For example, the estimator 206 can apply one type of estimation when the input voltage is below a threshold 506 and another type of estimation when the input voltage is above the threshold 506. In other examples, more than two different estimation functions may be used across the range of input voltages.

As one example, the current estimator 206 performs an approximate linear fitting when a fully differential reference voltage applied to the ADC 102 is less than a fitting threshold (e.g., (VREFP−VREFM)/$2^N$) 506, such as shown as linear region 502. The current estimator 206 can approximate the reference load current as below the threshold 506 because of the non-quadratic nature of the reference load current curve 420 within voltage region 502, as illustrated.

Additionally, in this example, the current estimator 206 performs a quadratic fitting when the fully differential reference voltage is above the threshold 506. For example, the current estimator 206 performs a quadratic fitting when the fully differential reference voltage is in a range greater than approximately (VREFP−VREFM)/$2^N$ and less than (VREFP−VREFM). Such is performed by the current estimator 206 because of the predictable smooth curvature of the reference load current curve 420 within this voltage region, as illustrated.

Figure 6:
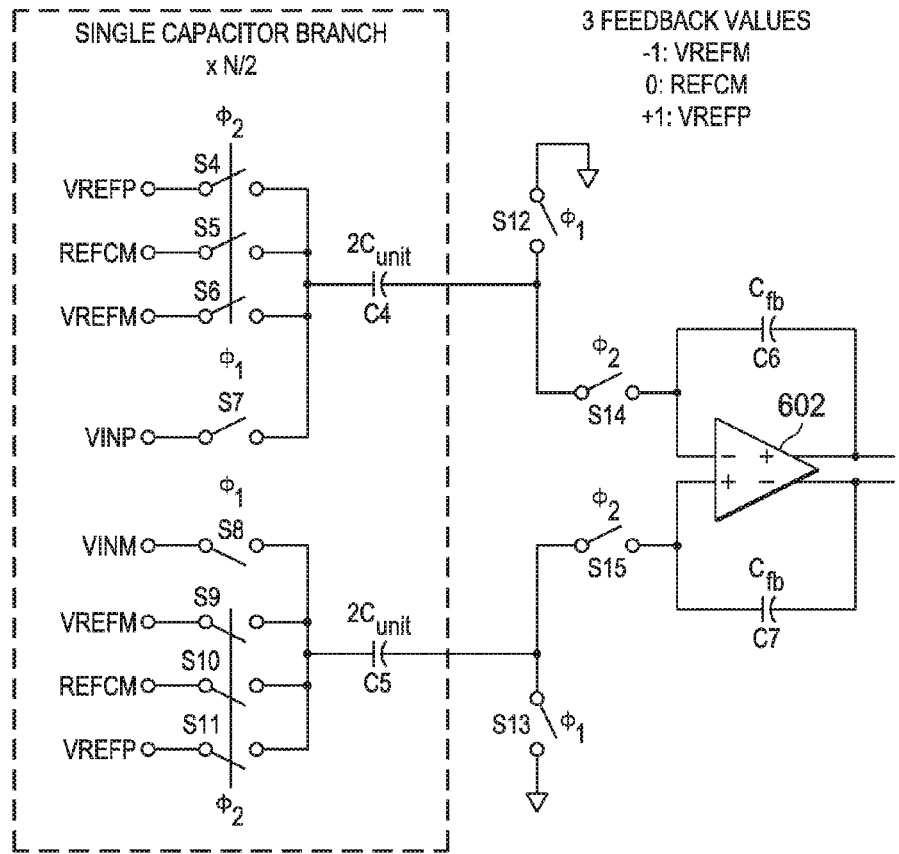
FIG. 6 illustrates an example ADC's first integrator.

FIG. 6 illustrates an example of first integrator of a delta-sigma ADC with sampling circuit and feedback DAC sharing a single capacitor branch. The integrator is demonstrated as a single capacitor branch with 3-level DAC unit 600 that includes an arrangement of switches S4-S15 and capacitors C4-C7 connected between nodes corresponding to reference voltages VREFP, VREFM, REFCM, VINP, and VINM, There are $2^{N-1}$ identical units, each is controlled by one from digital code −1, 0, +1. In particular, when $\Phi_2$ is high, +1 enables S4, S9, 0 enables S5, S10, and −1 enables S6, S11.

Figure 7:
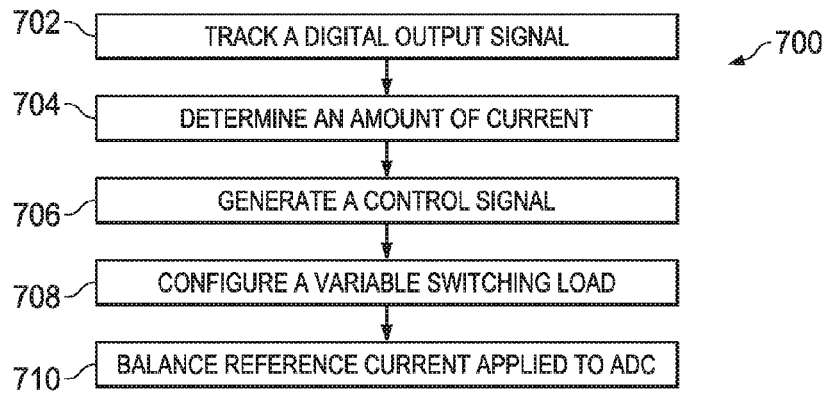
FIG. 7 is a flow diagram illustrating an example method for balancing a reference load of an ADC.

In view of the foregoing structural and functional features described above, a method in accordance with various aspects of the present disclosure will be better appreciated with reference to FIG. 7. While, for purposes of simplicity of explanation, the method of FIG. 7 is shown and described as executing serially, it is to be understood and appreciated that the present disclosure is not limited by the illustrated order, as some aspects could, in accordance with the present disclosure, occur in different orders and/or concurrently with other aspects from that shown and described herein. Moreover, not all illustrated features may be required to implement a method in accordance with an aspect of the present disclosure. Moreover, for simplicity of explanation, the methods of FIG. 7 can include additional functional features not discussed, with FIG. 7 being described with reference to the examples illustrated herein.

FIG. 7 illustrates an example method 700 for balancing a reference load current of the ADC 102. At 702 a digital output signal of the delta-sigma modulator 105 is tracked. In an example, the tracking circuit 104 tracks the digital output signal the delta-sigma modulator 105.

At 704, a determination is made as to an amount of current to apply to positive and negative reference voltages of the ADC 102/200. In an example, the current estimator 107 determines an amount of current to apply to positive and negative reference voltages VREFP and VREFM of the ADC 102/200, such as to reference voltage nodes (e.g., rails) that supply the positive and negative reference voltages VREFP and VREFM. For instance, the current estimator 206 determines an amount of current to apply to positive and negative reference voltages of the ADC 102/200, VREFP and VREFM, based on an averaged tracked current from output of the ADC 102/200.

At 706, a control signal is generated. In an example, the tracking circuit 104 generates a control signal indicating the amount of current to apply to the positive and negative reference voltages VREFP and VREFM. In another example, the current estimator 206 of the tracking circuit generates a control signal indicating the amount of current to apply to the positive and negative reference voltages VREFP and VREFM.

At 708, a variable switching load is configured, which is connected to the positive and negative reference voltages, based on the control signal. In an example, the switching load circuit 106 includes a variable switching load that is connected to the reference voltages VREFP and VREFM. The control signal controls the variable switching load. In another example, the switching load 310 includes a first capacitor array C1 and a second capacitor array C2 that are coupled to positive and negative reference voltages VREFP and VREFM based on the control signal. The first capacitor array C1 and a second capacitor array C2 apply the variable switching load to the positive and negative reference voltages VREFP and VREFM based on the control signal.

At 710, a reference current applied to the analog-to-digital converter is balanced via the positive and negative reference voltages according to the configuration of the variable switching load. The switching load circuit 106/212 balances a reference current that is applied to the delta-sigma modulator 105/202. The reference current is balanced via the positive and negative reference voltages VREFP and VREFM according to the configuration of the variable switching load at 708.

What have been described above are examples of the disclosure. It is, of course, not possible to describe every conceivable combination of components or method for purposes of describing the disclosure, but one of ordinary skill in the art will recognize that many further combinations and permutations of the disclosure are possible. Accordingly, the disclosure is intended to embrace all such alterations, modifications, and variations that fall within the scope of this application, including the appended claims.

What is claimed is:
1. A circuit, comprising:
an delta sigma ADC (analog-to-digital converter) including:

a delta sigma modulator (DSM) to provide a DSM digital output signal, the delta sigma modulator including positive and negative reference voltage nodes, a digital decimation filter to provide an ADC output signal based on the DSM digital output signal, and reference load balancing circuitry to provide a selected amount of loading to the positive and negative reference voltage nodes to balance reference load current to the DSM, the reference load balancing circuitry including:

tracking circuitry to track the DSM digital output signal, and to provide a tracking signal representing an average of the DSM digital output signal during a time period;

a current estimator to determine, based on the tracking signal, an amount of loading to be applied to the positive and negative reference voltage nodes based on the tracking signal, and to provide a reference load current adjustment signal;

switching load circuitry coupled to the positive and negative reference voltage nodes, the switching load circuitry to provide the selected amount of loading to the positive and negative reference voltage nodes in response to a control signal; and switch control circuitry to provide the control signal to the switching load circuitry based on the reference load current adjustment signal.

2. The circuit of claim 1, wherein the switching load circuitry comprises a capacitor array to apply a variable capacitive load, corresponding to the selected amount of loading.

3. The circuit of claim 1, wherein the time period for averaging is based on a trade-off between a resolution for the balanced reference load current, and a delay in applying the balanced reference load current.

4. The circuit of claim 1, wherein the switch control circuitry comprises:

an AND gate including a first input coupled to a first clock signal and a second input coupled to an output of the switch control circuitry, an OR gate including a first input coupled to a second clock signal, and an inverter including an input coupled to the output of the switch control circuitry and an output coupled to a second input of the OR gate, wherein the first and second clock signals control gating of the control signal to the switching load circuitry.

5. The circuit of claim 1, wherein the tracking circuitry comprises:

an absolute generator to remove a sign bit associated with the DSM digital output signal; and an averaging filter to provide a time-averaged indication of the DSM digital output signal during the time period; and the current estimator to fit the time-averaged indication of the DSM digital output signal to a signal corresponding to the balanced reference load current.

6. The circuit of claim 5, the current estimator to perform a quadratic fitting of the time-averaged indication of the DSM digital output signal in response to an input signal of the delta-sigma modulator being greater than $(VREFP-VREFM)/2^N$, where VREFP is the positive reference voltage, VREFM is the negative reference voltage, and N is number of bits of a quantizer of the delta-sigma modulator, and to perform a linear approximation of the time-averaged indication of the DSM digital output signal in response to the input signal of the delta-sigma modulator being less than $(VREFP-VREFM)/2^N$.

7. The circuit of claim 1, wherein the switching load circuitry comprises a capacitor array that includes a plurality of capacitors coupled between the positive and negative reference voltage nodes, and a common mode reference of the delta-sigma modulator, the switching load circuitry selectively connecting one or more of the plurality of capacitors to the positive and negative reference voltage nodes based on the control signal.

8. A method for use in a delta sigma ADC (analog-to-digital converter) including a delta sigma modulator (DSM) with positive and negative reference voltage nodes, comprising:

tracking a DSM digital output signal of the delta-sigma modulator to provide a tracking signal, the tracking of the DSM digital output signal comprising averaging the DSM digital output signal;

determining, based on the tracking signal, an amount of balancing reference load current to apply to the positive and negative reference voltage nodes of the delta-sigma modulator to balance reference load current to the DSM;

generating a control signal indicating the amount of balancing reference load current to apply to the positive and negative reference voltage nodes;

providing, based on the control signal, a selected amount of loading to the positive and negative reference voltage nodes to provide the indicated amount of balancing reference load current.

9. The method of claim 8, wherein providing the selected amount of loading further comprises selectively connecting and disconnecting one or more capacitors of a switched capacitor array with the positive and negative reference voltage nodes to provide the balancing reference load current.

10. The method of claim 8, wherein the tracking signal is provided based on fitting a time-averaged indication of the DSM digital output signal to a value corresponding to the balancing reference load current.

11. The method of claim 10 wherein the tracking signal is provided based on:

a quadratic fitting of the time-averaged indication of the DSM digital output signal to the reference current in response to an input signal of the delta-sigma modulator being greater than $(VREFP-VREFM)/2^N$, where VREFP is the positive reference voltage, VREFM is the negative reference voltage, and N is number of bits of a quantizer of the delta-sigma modulator; and a linear approximation of the time-averaged indication of the DSM digital output signal to the reference load current in response to the input signal of the delta-sigma modulator being less than $(VREFP-VREFM)/2^N$.

12. The method of claim 8, further comprising selectively connecting one or more of a plurality of capacitors to the positive and negative reference voltage nodes based on the control signal.

13. The method of claim 8, wherein providing the selected amount of loading comprises applying positive and negative balancing currents to each of the positive and negative reference voltage nodes via a switched capacitor array to convert the control signal to a current.

14. A circuit for use in a delta-sigma ADC (analog-to-digital converter), comprising:

a delta-sigma modulator (DSM) to provide a DSM digital output signal in response to an analog input signal and based on positive and negative reference voltages applied to positive and negative reference voltage nodes;

tracking circuitry to track the DSM digital output signal and provide a tracking signal representing an average of the DSM digital output signal during a time period;

a current estimator to determine, based on the tracking signal, an amount of loading to be applied to the positive and negative reference voltage nodes, and to provide a reference load current adjustment signal;

switching load circuitry coupled to the positive and negative reference voltage nodes, the switching load circuitry to provide a selected amount of loading to the positive and negative reference voltage nodes in response to a control signal, to balance reference load current applied to the delta-sigma modulator; and switch control circuitry to provide the control signal to the switching load circuitry based on the reference load current adjustment signal, to balance reference load current to the delta-sigma modulator.

15. The circuit of claim 14, wherein the switch control circuitry comprises:

an AND gate including a first input coupled to a first clock signal and a second input coupled to an output of the switch control circuitry, an OR gate including a first input coupled to a second clock signal, and an inverter including an input coupled to the output of the switch control circuitry and an output coupled to a second input of the OR gate, wherein the first and second clock signals control gating of the control signal to the switching load circuitry.

16. The circuit according to claim 14, wherein the tracking circuit comprises:

an absolute generator to remove a sign bit associated with the DSM digital output signal; and an averaging filter to provide a time-averaged indication of the DSM digital output signal during the time period; and the current estimator to fit the time-averaged indication of the DSM digital output signal to a signal corresponding to the balanced reference load current.

17. The circuit of claim 16, the current estimator to perform a quadratic fitting of the time-averaged indication of the DSM digital output signal in response to an input signal of the delta-sigma modulator being greater than $(VREFP-VREFM)/2^N$, where VREFP is the positive reference voltage, VREFM is the negative reference voltage, and N is number of bits of a quantizer of the delta-sigma modulator, and to perform a linear approximation of the time-averaged indication of the DSM digital output signal in response to the input signal of the delta-sigma modulator being less than $(VREFP-VREFM)/2^N$.

18. The circuit of claim 14, wherein the switching load circuitry comprises a capacitor array to apply a variable capacitive load, corresponding to the selected amount of loading.

19. The circuit of claim 18, wherein the capacitor array includes a plurality of capacitors coupled between the positive and negative reference voltage nodes, and a common mode reference of the delta-sigma modulator, the switching load circuitry selectively connecting one or more of the plurality of capacitors to the positive and negative reference voltage nodes based on the control signal.

20. The circuit of claim 14, wherein the time period for averaging is based on a trade-off between a resolution for the balanced reference load current, and a delay in applying the balanced reference load current.

* * * * *